(12) United States Patent
Huang et al.

(10) Patent No.: US 11,133,485 B2
(45) Date of Patent: Sep. 28, 2021

(54) LIGHT-EMITTING DEVICE AND ELECTRODE THEREOF

(71) Applicant: Industrial Technology Research Institute, Hsinchu (TW)

(72) Inventors: Yi-Hsiang Huang, Changhua County (TW); Wei-Lung Tsai, Tainan (TW); Yu-Yu Ho, Yunlin County (TW); Yu-Hsiang Tsai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/727,927

(22) Filed: Dec. 27, 2019

(65) Prior Publication Data

US 2020/0227670 A1    Jul. 16, 2020

Related U.S. Application Data

(60) Provisional application No. 62/791,032, filed on Jan. 11, 2019.

(30) Foreign Application Priority Data

Oct. 22, 2019  (TW) .................. 108138035

(51) Int. Cl.
*H01L 51/52* (2006.01)
*H01L 27/32* (2006.01)

(52) U.S. Cl.
CPC ...... *H01L 51/5212* (2013.01); *H01L 27/3246* (2013.01); *H01L 51/5253* (2013.01); *H01L 51/5275* (2013.01); *H01L 2251/301* (2013.01); *H01L 2251/303* (2013.01); *H01L 2251/558* (2013.01)

(58) Field of Classification Search
CPC ................ H01L 51/5212; H01L 27/3246
See application file for complete search history.

(56) References Cited

U.S. PATENT DOCUMENTS

| | | | |
|---|---|---|---|
| 6,812,637 B2 | 11/2004 | Cok et al. | |
| 9,214,499 B2 | 12/2015 | Jeung et al. | |
| 9,680,132 B1* | 6/2017 | Tsai | .................. H01L 51/5284 |

(Continued)

FOREIGN PATENT DOCUMENTS

| | | |
|---|---|---|
| CN | 101127388 | 2/2008 |
| CN | 107039597 | 8/2017 |

(Continued)

OTHER PUBLICATIONS

"Office Action of Taiwan Counterpart Application", dated Aug. 17, 2020, p. 1-p. 9.

(Continued)

*Primary Examiner* — Julio J Maldonado
*Assistant Examiner* — Mohammad A Rahman
(74) *Attorney, Agent, or Firm* — JCIPRNET

(57) ABSTRACT

A light-emitting device and an electrode thereof are provided. The electrode includes a first electrode and an auxiliary electrode. The auxiliary electrode is disposed on the first electrode and covers a portion of the first electrode. A material of the first electrode is a metal oxide or alkali metal salt doped with a metal. A material of the auxiliary electrode includes a metal or an alloy thereof.

18 Claims, 13 Drawing Sheets

(56) References Cited

U.S. PATENT DOCUMENTS

| | | | | |
|---|---|---|---|---|
| 2005/0231102 A1* | 10/2005 | Chao | ............... | H01L 51/5281 |
| | | | | 313/504 |
| 2005/0253504 A1* | 11/2005 | Su | ............... | H01L 51/5253 |
| | | | | 313/504 |
| 2008/0036372 A1* | 2/2008 | Lee | ............... | H01L 51/524 |
| | | | | 313/504 |
| 2012/0018767 A1* | 1/2012 | Ikeda | ............... | H05B 33/26 |
| | | | | 257/99 |
| 2012/0111872 A1* | 5/2012 | Leu | ............... | A47J 36/02 |
| | | | | 220/573.1 |
| 2013/0119551 A1* | 5/2013 | Chen | ............... | H01L 23/488 |
| | | | | 257/773 |
| 2017/0155095 A1 | 6/2017 | Tsai et al. | | |
| 2018/0315801 A1* | 11/2018 | Matsueda | ............... | H01L 27/3218 |
| 2019/0088900 A1* | 3/2019 | Huang | ............... | H01L 27/3276 |

FOREIGN PATENT DOCUMENTS

| | | |
|---|---|---|
| CN | 109509843 | 3/2019 |
| EP | 1055961 | 12/2003 |
| EP | 1722425 | 11/2006 |
| KR | 100718267 | 5/2007 |
| TW | 201212326 | 3/2012 |
| TW | I569067 | 2/2017 |
| TW | I617019 | 3/2018 |
| TW | 201916425 | 4/2019 |

OTHER PUBLICATIONS

Office Action of China Counterpart Application, dated Jan. 6, 2021, pp. 1-7.

* cited by examiner

LIGHT-EMITTING DEVICE AND ELECTRODE THEREOF

CROSS-REFERENCE TO RELATED APPLICATION

This application claims the priority benefits of U.S. provisional application Ser. No. 62/791,032, filed on Jan. 11, 2019, and Taiwan application serial no. 108138035, filed on Oct. 22, 2019. The entirety of each of the above-mentioned patent applications is hereby incorporated by reference herein.

TECHNICAL FIELD

The disclosure relates to a light-emitting device and an electrode thereof.

BACKGROUND

A light-emitting device, such as a transparent light-emitting device, may be used in life to enhance the convenience of information dissemination, such as smart window displays, advertising billboards, car displays, etc., and thus has attracted attention and become one of the significant objects of technological development.

The light-emitting device is generally composed of electrode layer, light-emitting layer, driving element, and various wires (such as scan lines, data lines, etc.), and the electrode layer may be a transparent electrode to facilitate light emission. In order to make the transparent light-emitting device have high luminous efficiency, the transparency and conductivity of the transparent electrode need to be considered, especially when applied to a large-area light-emitting device panel where the conductivity of the light-emitting device is particularly significant.

In order to achieve high transparency, a high-transparency electrode may be introduced. However, a conventional metal-based transparent electrode causes a decrease in transmittance and affects the overall transmittance of the panel of the light-emitting device.

Another way to improve transmittance is to punch holes or perforations in a conventional metal-based transparent electrode. However, this causes the issue of uneven brightness, and increases the resistance and therefore sacrifices conductivity, thereby affecting the luminous efficiency of the element.

If an entire transparent metal oxide common cathode structure is used to manufacture the electrode of the transparent light-emitting device, a sputtering process is needed, which damages the surface of the light-emitting layer formed before the sputtering process of the electrode due to the sputtering process.

SUMMARY

An embodiment of the disclosure provides an electrode of a light-emitting device including a first electrode and an auxiliary electrode. The auxiliary electrode is disposed on the first electrode and covers a portion of the first electrode. A material of the first electrode is a metal oxide or alkali metal salt doped with a metal. A material of the auxiliary electrode includes a metal or an alloy thereof.

An embodiment of the disclosure provides a light-emitting device, including a substrate, an active device layer, an insulating layer, a pixel-defining layer, a light-emitting element, an auxiliary electrode, and a thin-film encapsulation layer, wherein the active device layer is disposed on the substrate. The insulating layer is disposed on the substrate and the active device layer. The pixel-defining layer is disposed on a portion of the insulating layer. The light-emitting element is disposed on the insulating layer and includes a first electrode, a light-emitting layer, and a second electrode, wherein the second electrode is disposed on the insulating layer and located between the insulating layer and the pixel-defining layer and electrically connected to the active device layer, and the light-emitting layer is located between the second electrode and the first electrode. The auxiliary electrode is disposed on a portion of the first electrode and covers the active device layer. The thin-film encapsulation layer covers the light-emitting element and the auxiliary electrode. A material of the first electrode is a metal oxide or alkali metal salt doped with a metal, and a material of the auxiliary electrode includes a metal or an alloy thereof.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
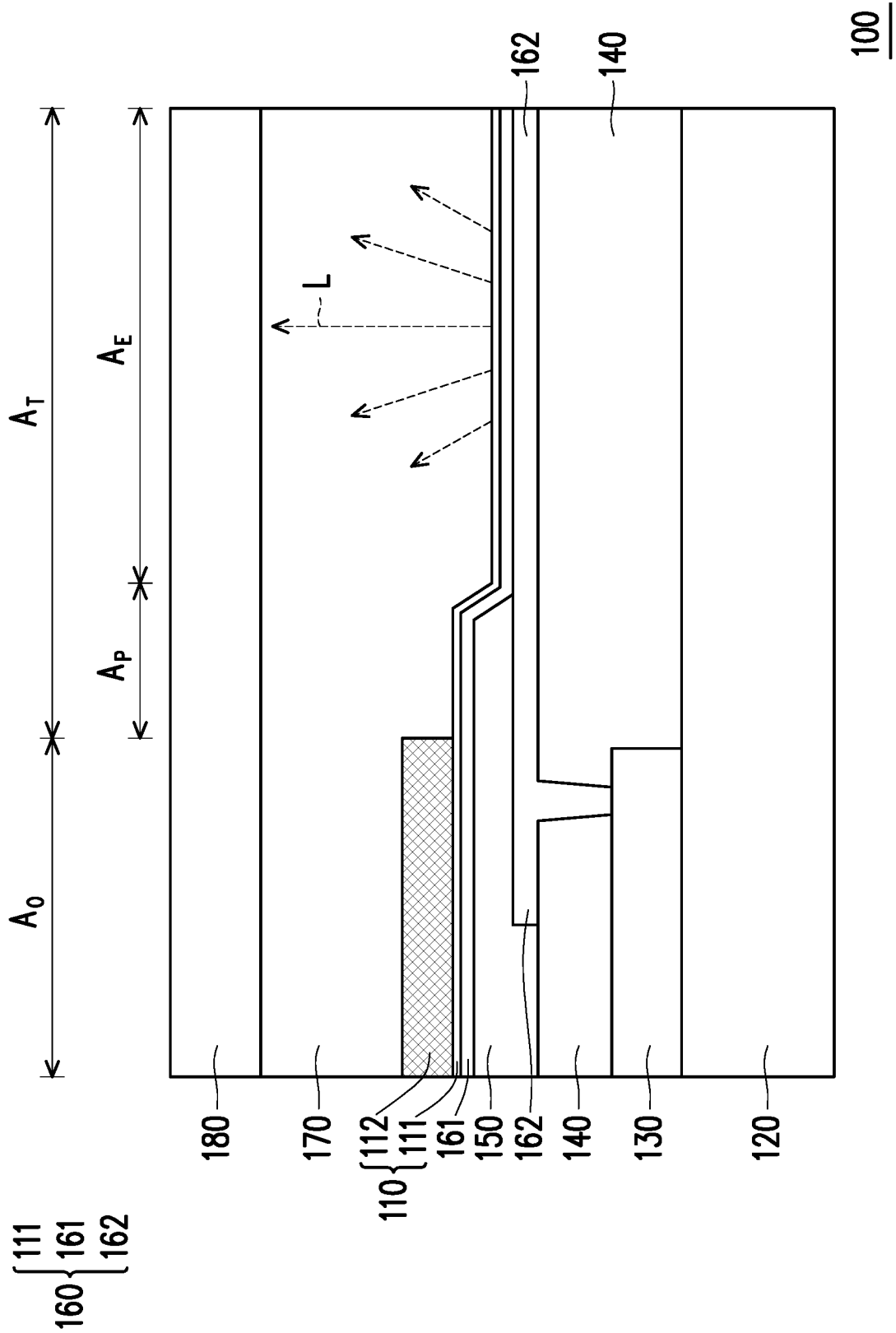
FIG. 1A is a cross-sectional view of a light-emitting device including an electrode according to the first embodiment of the disclosure.

Embodiments are provided hereinafter and described in detail with reference to figures. However, the embodiments provided are not intended to limit the scope of the disclosure. In addition, the element sizes in the drawings are drawn for convenience of description and do not represent actual element size ratios. Moreover, although different elements, and/or film layers are described using, for instance, "first" and "second" in the specification, the elements and/or film layers should not be limited to these terms. Instead, these terms are only used to distinguish an element or film layer from another element or film layer. Therefore, a first element or film layer discussed below may be referred to as a second element or film layer without violating the teaching of the embodiments.

Different examples in the description of embodiments of the disclosure may adopt repeated reference numerals and/or terms. These repeated numerals or terms are intended to simplify and clarify and are not intended to limit the relationship of each embodiment and/or the external structures. Furthermore, if the disclosure of the present specification describes forming a first feature on or above a second feature, it includes an embodiment in which the formed first feature is in direct contact with the second feature and also includes an embodiment in which additional features are formed between the first feature and the second feature such that the first feature and the second feature may not be in direct contact. To facilitate understanding, the same elements in the following are described with the same reference numerals.

Figure 1B:
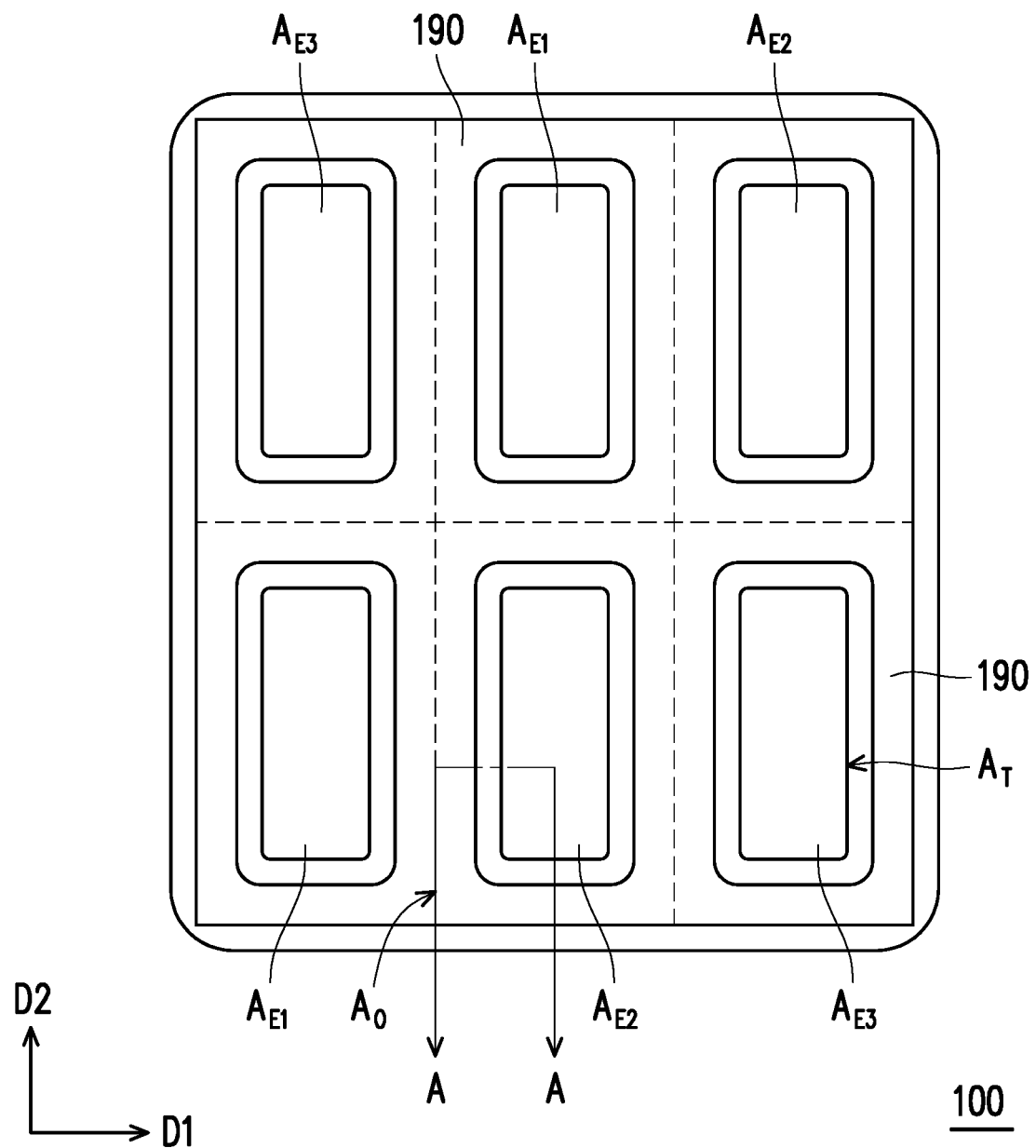
FIG. 1B is a top view of a light-emitting device including a plurality of pixels.

FIG. 1A is a cross-sectional view of a light-emitting device including an electrode according to the first embodiment of the disclosure, and FIG. 1B is a top view of a light-emitting device including a plurality of pixels, wherein FIG. 1A is a cross-sectional view of the light-emitting device of FIG. 1B drawn along line A-A.

Referring to FIG. 1A, as shown in FIG. 1A, an electrode 110 of a light-emitting device 100 of the first embodiment includes a first electrode 111 and an auxiliary electrode 112. The auxiliary electrode 112 is disposed on the first electrode 111 and covers a portion of the first electrode 111.

The material of the first electrode 111 is a metal oxide or alkali metal salt doped with a metal. For example, the metal oxide may include, but is not limited to, $LiO_2$ (lithium superoxide) or $MoO_3$ (molybdenum trioxide). The alkali metal salt may include, but is not limited to, LiF (lithium fluoride), $LiBO_3$ (lithium borate), $K_2SiO_3$ (potassium silicate), $Cs_2CO_3$ (cesium carbonate), $CH_3COOM$ (acetate) (M is Li (lithium), Na (sodium), K (potassium), Rb (rubidium), or Cs (cesium)). The metal may include, but not limited to, Al (aluminum), Ca (calcium), Ag (silver), Cu (copper), Mg (magnesium), or an alloy thereof such as Mg:Ag, Li:Al, or the like. In the embodiment of FIG. 1A, the first electrode 111 may be manufactured by co-vapor deposition, for example, co-vapor deposition using different vapor deposition sources in a vacuum chamber, so that metal oxide and metal or alkali metal salt and metal may be deposited at a similar weight or volume ratio, wherein the mixed weight ratio of metal to metal oxide or metal to alkali metal salt is, for example, between 2:1 and 1:5. In an embodiment of the invention, the mixed weight ratio of metal to metal oxide or metal to alkali metal salt is, for example, 1:1 to 2:3, but the disclosure is not limited thereto. Further, the thickness of the first electrode 111 is less than or equal to 30 nm, and in an embodiment, the thickness of the first electrode 111 is, for example, between 5 nm and 15 nm.

The material of the first electrode 111 may be doped with an organic material in addition to a metal oxide or alkali metal salt doped with a metal to improve transparency.

The auxiliary electrode 112 includes a conductive metal material or alloy, and may include, but not limited to, Mg (magnesium), Al (aluminum), Ag (silver), Au (gold), or Cu (copper). The auxiliary electrode 112 may be in direct contact with the first electrode 111 or other elements may be provided between the auxiliary electrode 112 and the first electrode 111. The forming of the auxiliary electrode 112 includes vapor deposition, ink-jet printing (IJP), screen printing, sputtering, and the like. When the mixed weight of the metal and the metal oxide or the metal and the alkali metal salt has a specific ratio and matches the thickness of the first electrode 111, the first electrode 111 having high transmittance and a certain conductivity may be formed, and when the auxiliary electrode 112 increasing the conductivity of the panel is included, the transparency of the transparent light-emitting device may be increased.

Referring to FIG. 1A again, the light-emitting device 100 of the first embodiment of FIG. 1A includes a light-emitting element 160, wherein the light-emitting element 160 may include the first electrode 111, a light-emitting layer 161, and a second electrode 162.

In an embodiment of the disclosure, the light-emitting element 160 may include a first carrier injection layer (not shown), a first carrier transmission layer (not shown), a second carrier blocking layer (not shown), an emission layer 161, a first carrier blocking layer (not shown), a second carrier transmission layer (not shown), and a second carrier injection layer (not shown) sequentially disposed from the second electrode 162 to the first electrode 111. The first carrier and the second carrier may be different types of carriers. For example, the first carrier is an electron hole and the second carrier is an electron, but the embodiments of the disclosure are not limited thereto, and adjustments may be made as needed. The composition of the light-emitting element 160 is also not limited in the embodiments of the disclosure. In an embodiment of the disclosure, the light-emitting layer 161 is, for example, suitable for an organic light-emitting element, such as various possible organic light-emitting layers of an organic light-emitting diode (OLED) display device, or an inorganic light-emitting layer (or quantum dot light-emitting layer) suitable for a quantum dot light-emitting diode (LED) display device. However, the embodiments of the disclosure are not limited thereto.

The second electrode 162 may be used as an anode of the light-emitting element 160, and the first electrode 111 may be used as the cathode of the light-emitting element 160, and the anode and the cathode are used to supply a current to the light-emitting layer 161 such that the light-emitting layer 161 emits a light L. According to an embodiment of the disclosure, in the transparent light-emitting element, the second electrode 162 and the first electrode 111 may both be transparent electrodes. The material of the second electrode 162 may include a metal oxide such as indium tin oxide (ITO), indium zinc oxide (IZO), aluminum-doped zinc oxide (AZO), zinc oxide (ZnO), or gallium-doped zinc oxide (GZO), etc., but is not limited to these materials.

In an embodiment, the first electrode 111 is formed by a vapor deposition process, and the auxiliary electrode 112 may also adopt a vapor deposition process, so that the manufacture of an active matrix OLED (AMOLED) is highly compatible with existing AMOLED processes.

Referring to FIG. 1A again, the light-emitting device 100 further includes a substrate 120, an active device layer 130, an insulating layer 140, a pixel-defining layer (PDL) 150, a light-emitting element 160, an auxiliary electrode 112, a thin-film encapsulation layer 170, and a cover plate 180. The light-emitting element 160 includes the second electrode 162, the light-emitting layer 161, and the first electrode 111. The active device layer 130 is disposed on the substrate 120, the insulating layer 140 is disposed on the substrate 120 and the active device layer 130, the second electrode 162 is disposed on the insulating layer 140 and electrically connected to the active device layer 130, the pixel-defining layer 150 is disposed on a portion of the second electrode 162 and the insulating layer 140, the light-emitting layer 161 is disposed on the second electrode 162 and the pixel-defining layer 150, the first electrode 111 is disposed on the light-emitting layer 161, and the auxiliary electrode 112 is disposed on the first electrode 111 and covers the active device layer 130 and exposes a portion of the first electrode 111, wherein the first electrode 111 is disposed between the auxiliary electrode 162 and the light-emitting layer 161. The thin-film encapsulation layer 170 is disposed on the auxiliary electrode 112 and the first electrode 111 not covered by the auxiliary electrode 112, and the cover plate 180 is disposed on the thin-film encapsulation layer 170. Alternatively, a buffer layer (not shown) may be optionally formed on the substrate 120 before the other elements are formed.

Referring to FIG. 1A and FIG. 1B simultaneously, FIG. 1B is a top view of the light-emitting device 100 including a plurality of pixels. The light-emitting device 100 may define a plurality of pixels 190 via the pixel-defining layer 150. A light-emitting region $A_E$ in the pixels 190 is defined by the second electrode 162, the light-emitting layer 161, and the first electrode 111 outside a pixel-defining layer region $A_P$ in the pixels 190. The light-emitting layer 161 sandwiched between the second electrode 162 and the first electrode 111 may emit the light L to form the light-emitting region $A_E$. In the present embodiment, the plurality of pixels 190 are arranged in an array on the substrate 120. The light-emitting device 100 includes a non-light-transmitting region $A_O$ and a light-transmitting region $A_T$. A region outside the light-transmitting region $A_T$ is a position in which the auxiliary electrode 160 is disposed in order to form the non-light-transmitting region $A_O$. The light-transmitting region $A_T$ includes the pixel-defining layer region $A_P$ and the light-emitting region $A_E$. That is, the auxiliary electrode 112 is disposed in the non-light-transmitting region $A_O$, and in addition, the auxiliary electrode 112 covers the active device layer 120. The auxiliary electrode 112 may optionally cover the entire pixel-defining layer 150.

Referring to FIG. 1A and FIG. 1B again, in the present embodiment, the color of the light emitted by the light-emitting layer 161 of each pixel in the plurality of pixels 190 and the color of the light emitted by the light-emitting layer 161 of the pixel adjacent thereto may be the same or different. The light-emitting layer 161 of the light-emitting device 100 includes a first color light-emitting layer (for example, the light-emitting region shown in FIG. 1B is $A_{E1}$), a second color light-emitting layer (for example, the light-emitting region shown in FIG. 1B is $A_{E2}$), and a third color light-emitting layer (for example, the light-emitting region shown in FIG. 1B is $A_{E3}$) in different pixels. In the embodiment shown in FIG. 1B, the light-emitting regions $A_{E1}$, $A_{E2}$, and $A_{E3}$ are sequentially and repeatedly arranged along a first direction D1 on the substrate 120 as shown in FIG. 1B, and in a second direction D2, the light-emitting regions are sequentially and repeatedly arranged in the order of $A_{E1}$, $A_{E3}$, and $A_{E2}$. The first direction D1 is substantially perpendicular to the second direction D2. In an embodiment, the color of the light emitted by the light-emitting layer 161 of each pixel, such as a first color, a second color, and a third color, may be red, blue, and green, respectively, but in other embodiments, the first color, the second color, and the third color may also be other colors, and the disclosure does not limit the colors of the first color, the second color, and the third color. In addition, the above description is based on the case in which the light-emitting device 100 includes three pixel colors, but the light-emitting device 100 may also include three or more or three or less pixel colors, and the disclosure is not limited in this regard.

The arrangement of different color pixels in the embodiment of FIG. 1B is merely an example. The disclosure does not limit the arrangement of the pixels. In addition, the pixel areas of different colors may be the same or different, and the disclosure is also not limited in this regard.

Figure 1C:
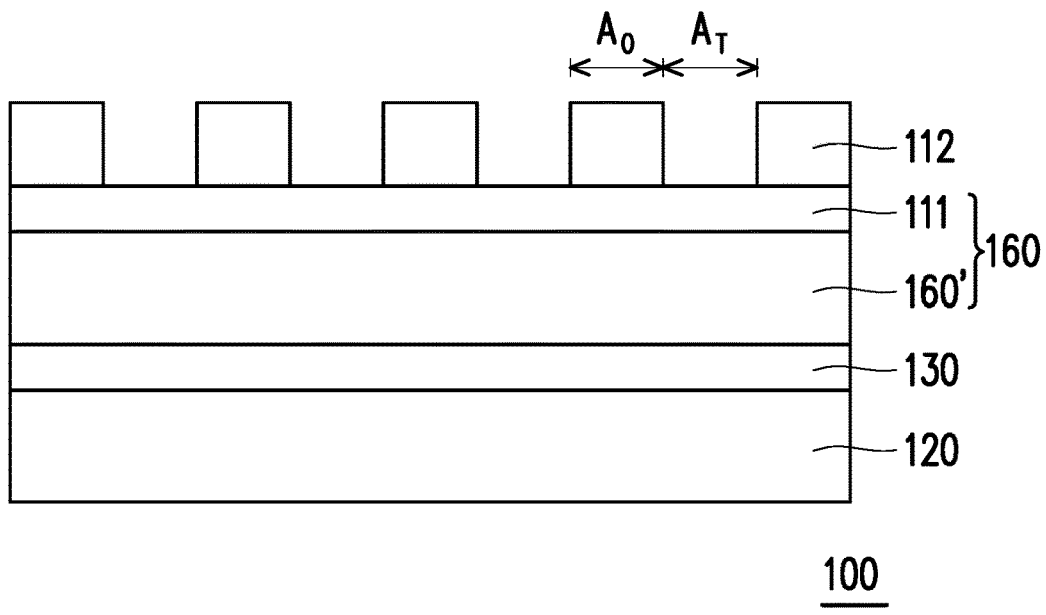
FIG. 1C is a cross-sectional view of a light-emitting device including a plurality of pixels.

Referring to FIG. 1C, FIG. 1C is a cross-sectional view of the light-emitting device 100 including the plurality of pixels 190, wherein FIG. 1C only shows some elements of the light-emitting device 100. As shown in FIG. 1C, the light-emitting device 100 only shows the substrate 120, the active device layer 130, the light-emitting element 160, and the auxiliary electrode 112. The light-emitting element 160 includes a structure 160' composed of a second electrode and a light-emitting layer, the first electrode 111, and the auxiliary electrode 112. If the second electrode is already manufactured in the active device layer 130, then the structure 160' may be a light-emitting layer. The light-emitting device 100 of FIG. 1C may also include components shown in FIG. 1A and FIG. 1B but not shown in FIG. 1C, and details are not repeated herein. The auxiliary electrode 112 is a patterned structure, the region in which the auxiliary electrode 112 is located is the non-transmitting region $A_O$, and between the auxiliary electrodes 112 is the light-transmitting region $A_T$.

The substrate 120 is, for example, a flexible substrate, and the material of the substrate 120 includes glass, metal foil, plastic material, or polymer material, such as polyimide (PI), PI and inorganic mixture (hybrid PI), polyethylene terephthalate (PET), polyethersulfone (PES), polyacrylate (PA), polyethylene naphthalate (PEN), polycarbonate (PC), polynorbornene (PNB), polyetherimide (PEI), polyetheretherketone (PEEK), cycloolefin polymer (COP), polymethyl methacrylate (PMMA), glass fiber-reinforced plastic (GFRP), carbon fiber-reinforced polymer (CFRP) composite material, etc. or other suitable soft materials. However, in other embodiments not shown, the substrate 110 may also be made of glass or other hard materials. Alternatively, the substrate 120 may also be a composite substrate formed by a multilayer organic material and/or inorganic material having the function of blocking water vapor to provide the function of blocking water vapor, and the disclosure does not limit the type and composition of the substrate 120.

The active device layer 130 includes, for example, a thin-film transistor (TFT) or an organic thin-film transistor (OTFT), but the disclosure does not limit that the active device layer 130 includes a TFT or the TFT is an OTFT.

The insulating layer 140 is, for example, an organic passivation layer (OPV), and may be patterned such that the second electrode 162 and the active device layer 130 are electrically connected.

The pixel-defining layer 150 is, for example, a photosensitive resin. The thin-film encapsulation layer 170 may include a plurality of inorganic thin films stacked on each other, and the inorganic thin films include alternately stacked silicon nitride thin films and silicon oxycarbide (SiOC) thin films. However, in other embodiments of the disclosure, the number of layers and material of the inorganic thin films are not limited. In the other embodiments, the thin-film encapsulation layer 170 includes a single layer or multiple layers of organic thin films or inorganic thin films alternately stacked, or may be a combination of the above. For example, the inorganic material includes aluminum oxide ($Al_2O_3$), silicon oxide ($SiO_x$), silicon nitride ($SiN_x$), silicon oxynitride ($SiO_xN_y$), or silicon oxycarbide (SiOC); the organic material includes parylene, polymer, or acrylic. Appropriate modifications may be made according to actual design requirements.

The cover plate 180 is, for example, a flexible substrate, and the material of the cover plate 180 includes glass, metal foil, plastic material, or polymer material, such as polyimide (PI), PI and inorganic mixture (hybrid PI), polyethylene terephthalate (PET), polyethersulfone (PES), polyacrylate (PA), polyethylene naphthalate (PEN), polycarbonate (PC), polynorbornene (PNB), polyetherimide (PEI), polyetheretherketone (PEEK), cycloolefin polymer (COP), polymethyl methacrylate (PMMA), glass fiber-reinforced plastic (GFRP), carbon fiber-reinforced polymer (CFRP) composite material, etc. or other suitable soft materials. However, in other embodiments not shown, the cover plate 180 may also be made of glass or other hard materials. Alternatively, the cover plate 180 may also be a composite substrate formed by a multilayer organic material and/or inorganic material having the function of blocking water vapor to provide the function of blocking water vapor, and the disclosure does not limit the type and composition of the substrate 180.

Figure 2:
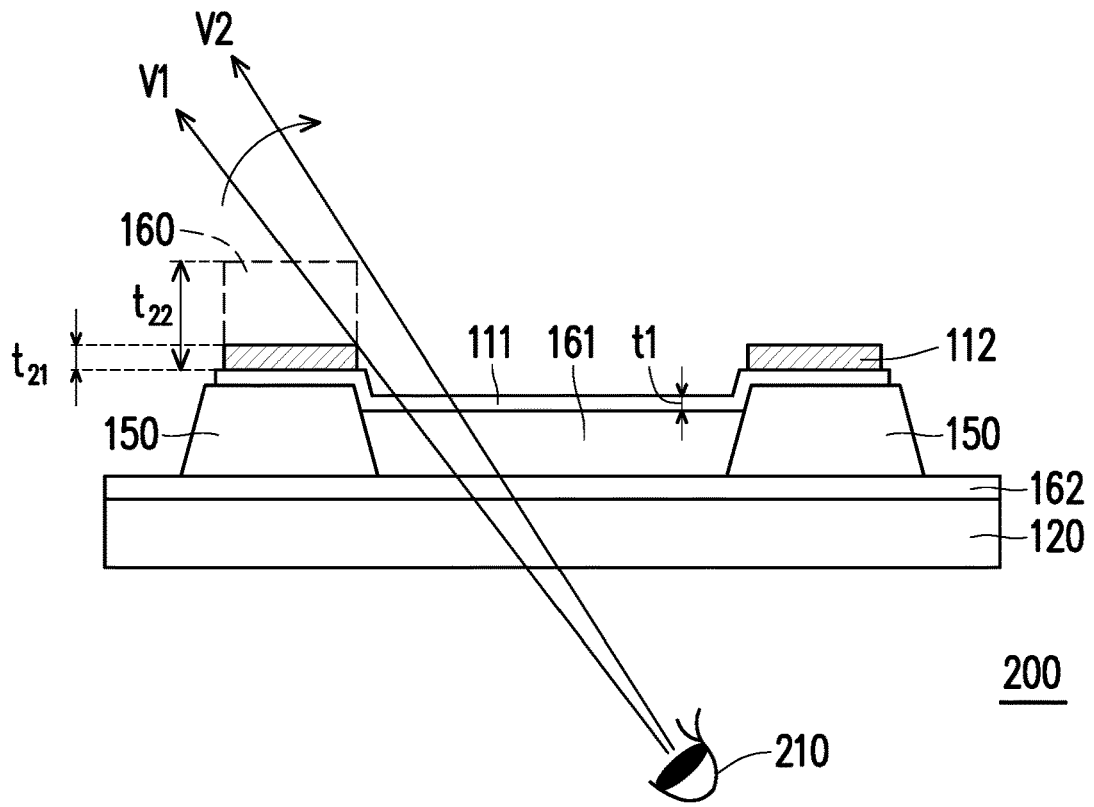
FIG. 2 is a schematic view of the relationship between the thickness of an auxiliary electrode and the viewing angle of a viewer.

Referring to FIG. 2, FIG. 2 is a schematic view of the relationship between the thickness of an auxiliary electrode and the viewing angle of a viewer. A light-emitting device 200 of FIG. 2 only shows the substrate 120, the second electrode 162, the pixel-defining layer 150, the light-emitting layer 161, the first electrode 111, and the auxiliary electrode 112, and other elements shown in FIG. 1A are not shown. The first electrode 111 has a thickness $t_1$ and $t_1$ is less than 30 nm. When the thickness of the auxiliary electrode 112 is $t_{21}$ and $t_{22}$ respectively ($t_{22}$ is greater than $t_{21}$), the visual line of sight of a viewer 210 is V1 and V2, respectively, and it may be seen that when the thickness of the auxiliary electrode 112 is $t_{21}$ and $t_{22}$, respectively, the viewing angle of the viewer 210 are not the same, and the viewing angle of the viewer 210 is larger when the auxiliary electrode 112 has a smaller thickness $t_{21}$. When the auxiliary electrode 112 has a larger thickness $t_{22}$, the viewing angle of the viewer 210 is smaller. When the cathode resistance of the light-emitting device 200 is too high, the light-emitting device 200 readily emits uneven light, and the total cathode resistance of the light-emitting device 200 is determined by the first electrode 111 and the auxiliary electrode 112, and the two resistances are in a parallel relationship. When the resistance of the first electrode 111 is larger, the resistance of the auxiliary electrode 112 needs to be lowered to prevent the light-emitting device 200 from emitting uneven light. However, in order to increase the transparency of the light-emitting device 200, the thickness of the first electrode 111 needs to be thin, that is, the thickness of the first electrode 111 is inversely related to the transparency of the light-emitting device 200, and the thickness of the auxiliary electrode 112 needs to be increased accordingly such that the total cathode resistance is within a certain range, and the light-emitting device 200 is prevented from emitting uneven light. However, as described above, if the thickness of the auxiliary electrode 112 is too thick, the viewing angle of the viewer 210 is affected. Therefore, the thickness of the auxiliary electrode 112 needs to match the thickness of the first electrode 111 to achieve high transparency and uniform illumination of the transparent light-emitting device 200. Therefore, when the thickness of the first electrode 111 is less than or equal to 30 nm, the thickness of the auxiliary electrode 112 is 300 nm to 1500 nm. In an embodiment, the thickness of the first electrode 111 is, for example, 10 nm, and the thickness of the auxiliary electrode 112 is, for example, 500 nm.

The display device completed in the above embodiment may be applied to a medium to large size transparent display, for example, a transparent display of 15 inches or more.

Figure 3:
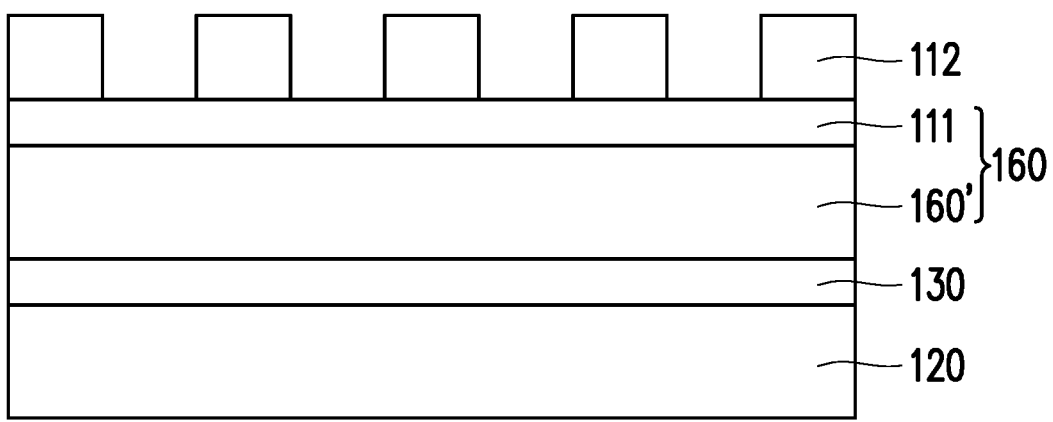
FIG. 3 is a cross-sectional view of a light-emitting device including an electrode according to the second embodiment of the disclosure.

FIG. 3 is a cross-sectional view of a light-emitting device including a transparent electrode according to the second embodiment of the disclosure.

Referring to FIG. 3, as shown in FIG. 3, a light-emitting device 300 of the present embodiment is similar to the light-emitting device 100 of the first embodiment shown in FIG. 1C, so the same elements are denoted by the same reference numerals as provided in the description of the first embodiment and are not repeated herein. The main difference between the light-emitting device 300 and the light-emitting device 100 is that the metal doped in the metal oxide or alkali metal salt in the first electrode 111 of the light-emitting device 300 includes at least two different metals. The metal may include, but not limited to, Al (aluminum), Ca (calcium), Ag (silver), Cu (copper), Mg (magnesium), or an alloy thereof such as Mg:Ag, Li:Al, or the like. In the embodiment shown in FIG. 3, the first electrode 111 may also be manufactured by co-vapor deposition, for example, co-vapor deposition using different vapor deposition sources in a vacuum chamber, such that metal oxide and at least two different metals or alkali metal salt and at least two metals may be simultaneously deposited at a similar weight or volume ratio, wherein the mixed weight ratio of the at least two metals to the metal oxide or the metals to the alkali metal salt is, for example, between 2:1 and 1:5, but the embodiments of the disclosure are not limited to this range of the mixed weight ratio. In the embodiment shown in FIG. 3, the thickness of the first electrode 111 is less than or equal to 30 nm.

In the present embodiment, the first electrode 111 formed by doping two different metals in metal oxide or alkali metal salt may enhance the conductivity or electron injection capability thereof, and with the auxiliary electrode, such as patterning the auxiliary electrode on the first electrode 111, the impedance of the series connection of the electrodes may be reduced.

Figure 4:
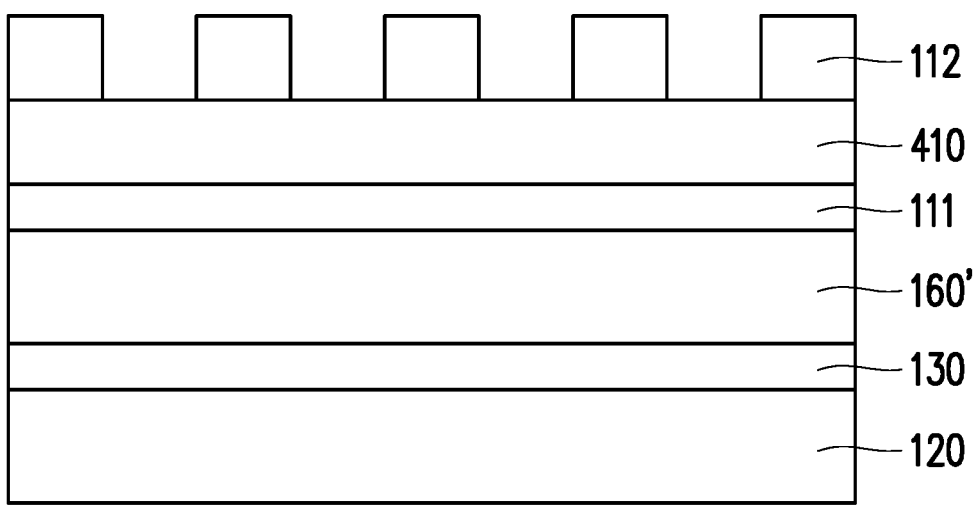
FIG. 4 is a cross-sectional view of a light-emitting device including an electrode according to the third embodiment of the disclosure.

FIG. 4 is a cross-sectional view of a light-emitting device including a transparent electrode according to the third embodiment of the disclosure.

Referring to FIG. 4, as shown in FIG. 4, a light-emitting device 400 of the present embodiment is similar to the light-emitting device 100 of the first embodiment shown in FIG. 1C, so the same elements are denoted by the same reference numerals and are not repeated herein. The main difference between the light-emitting device 400 and the light-emitting device 100 is that the light-emitting device 400 further includes a metal oxide layer 410 disposed between the first electrode 111 and the auxiliary electrode 112. The material of the metal oxide layer 410 includes indium tin oxide (ITO), indium zinc oxide (IZO), aluminum-doped zinc oxide (AZO), zinc oxide (ZnO), or gallium-doped zinc oxide (GZO), etc., but the embodiments of the disclosure are not limited to these materials. The metal oxide layer 410 has a thickness of less than 200 nm. The manner in which the metal oxide layer 410 is formed may include sputtering. In the embodiment shown in FIG. 4, the metal doped in the metal oxide or alkali metal salt may also include at least two different metals. If the first electrode 111 is formed by doping a metal in metal oxide, the metal oxide layer 410 and the metal oxide in the first electrode 111 may be the same or different.

In the embodiment shown in FIG. 4, the metal oxide layer 410 is disposed between the first electrode 111 and the auxiliary electrode 112 to further improve the uniformity and transparency of the panel.

Figure 5:
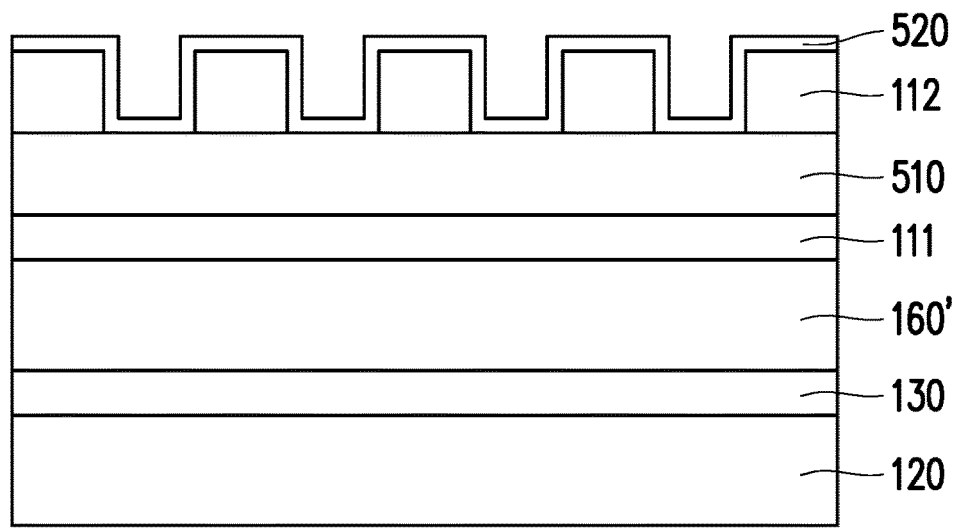
FIG. 5 is a cross-sectional view of a light-emitting device including an electrode according to the fourth embodiment of the disclosure.

FIG. 5 is a cross-sectional view of a light-emitting device including a transparent electrode according to the fourth embodiment of the disclosure.

Referring to FIG. 5, as shown in FIG. 5, a light-emitting device 500 of the present embodiment is similar to the light-emitting device 100 of the first embodiment shown in FIG. 1C, so the same elements are denoted by the same reference numerals as provided in the description of the first embodiment and are not repeated herein. The main difference between the light-emitting device 500 and the light-emitting device 100 is that the light-emitting device 500 further includes a metal layer 510 disposed between the first electrode 111 and the auxiliary electrode 112 and an optical matching layer 520 covering the auxiliary electrode 112. The optical matching layer 520 may be conformally formed on the auxiliary electrode 112, and the optical matching layer 520 covers the upper surface and the side surface of the auxiliary electrode 112 and the surface of the metal layer 510 exposed by the auxiliary electrode 112. The material of the metal layer 510 includes silver (Ag), gold (Au), or the like, but is not limited thereto. The metal layer 510 has a thickness between about 5 nm and 10 nm and a transmittance of greater than or equal to 50%. The manner in which the metal layer 510 is formed includes vapor deposition. The material of the optical matching layer 520 may be, for example, a material of a hole transport layer (HTL), but is not limited thereto. The thickness of the optical matching layer 520 is between about 5 nm and 150 nm, the refractive index thereof is 1.3 to 2.5, and the manner in which the optical matching layer 520 is formed includes vapor deposition. By adjusting the material (refractive index) of the optical matching layer 520, the total reflection phenomenon in each film layer of the device may be reduced and the absorption peak of the metal layer 510 for transmitted light may be adjusted, thereby increasing light extraction efficiency. In the embodiment shown in FIG. 5, the metal doped in the metal oxide or alkali metal salt may also include at least two different metals.

In the embodiment shown in FIG. 5, the optical matching layer 520 may be omitted based on design requirements. Compared with the use of transparent conductive oxide (such as ITO or the like) as the electrode, the use of the metal layer 510 in the embodiment shown in FIG. 5 may improve conductivity, and the thickness may be smaller than that of the transparent conductive oxide, and the yellowness index b* is smaller and an additional chamber for sputtering is not needed. Due to the arrangement of the metal layer 510 and the optical matching layer 520, the uniformity and transparency of the panel of the light-emitting device may be further improved.

Figure 6:
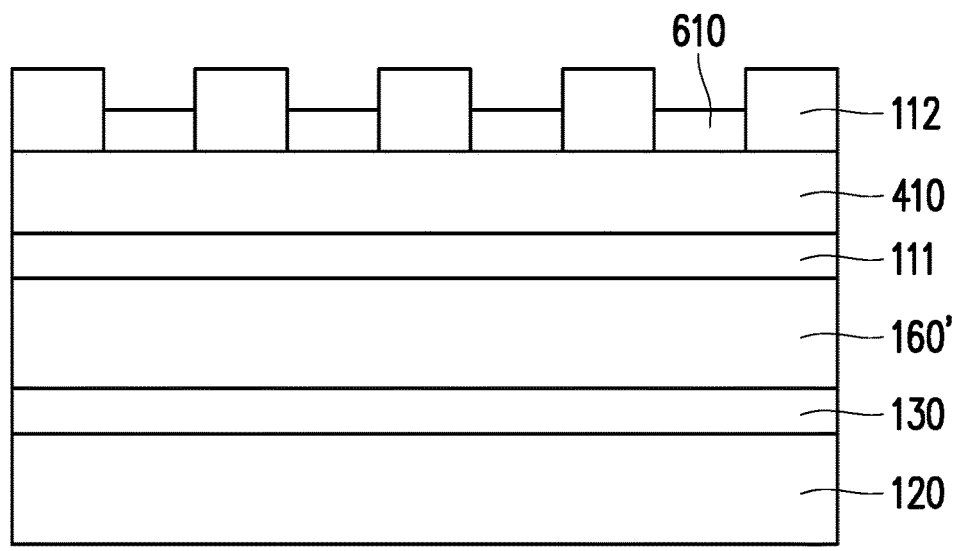
FIG. 6 is a cross-sectional view of a light-emitting device including an electrode according to the fifth embodiment of the disclosure.

FIG. 6 is a cross-sectional view of a light-emitting device including a transparent electrode according to the fifth embodiment of the disclosure.

Referring to FIG. 6, as shown in FIG. 6, a light-emitting device 600 of the present embodiment is similar to the light-emitting device 400 of the third embodiment shown in FIG. 4, so the same elements are denoted by the same reference numerals as provided in the description of the third embodiment and are not repeated herein. The main difference between the light-emitting device 600 and the light-emitting device 400 is that the light-emitting device 600 further includes an alienation layer 610 disposed on the metal oxide layer 410 exposed by the auxiliary electrode 112. The alienation layer 610 may include an organic material having a thickness of about 20 nm to 30 nm, and the alienation layer 610 may be formed by vapor deposition, and the alienation layer 610 may have optical matching. In an embodiment, the patterned alienation layer 610 may be formed first, and then the patterned auxiliary electrode 112 may be formed by, for example, vapor deposition. In an embodiment, the metal oxide layer 410 may also be replaced with a metal layer or the metal oxide layer 410 may be omitted. The metal layer may include silver (Ag) or gold (Au), and the thickness is, for example, between about 5 nm and 10 nm. Moreover, in the embodiment shown in FIG. 6, the metal doped in the metal oxide or alkali metal salt may also include at least two different metals.

In the embodiment shown in FIG. 6, the first electrode 111 is combined with the metal oxide layer 410 and the auxiliary electrode 112 to further improve the uniformity and transparency of the panel of the light-emitting device. The auxiliary electrode 112 may be provided with the alienation layer 610 with optical matching for metal patterning to improve transparency.

Figure 7A:
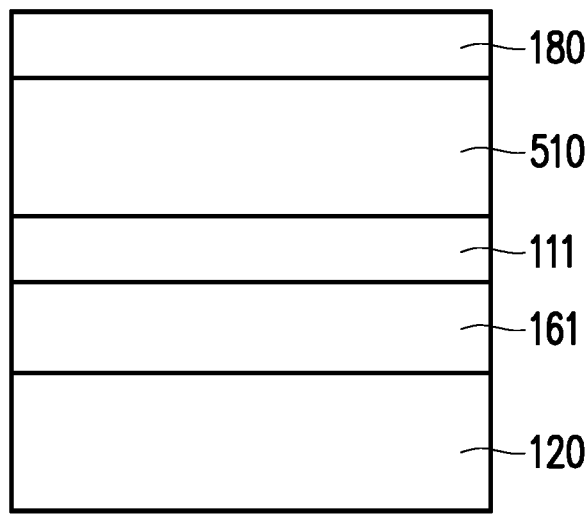
FIG. 7A and FIG. 7B show the structure of a first group of light-emitting devices used in optical simulation.
Figure 7B:
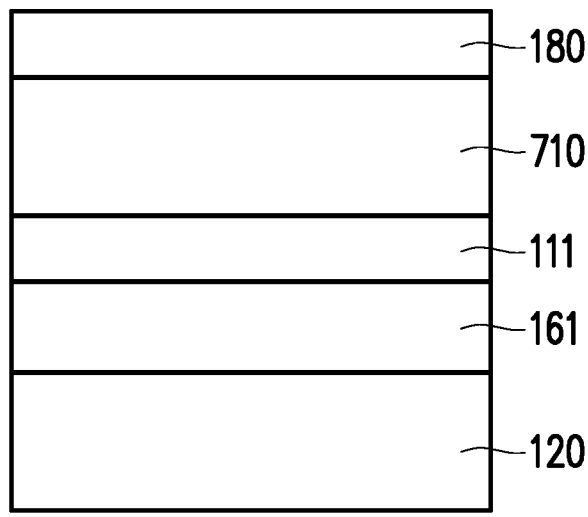
Figure 7C:
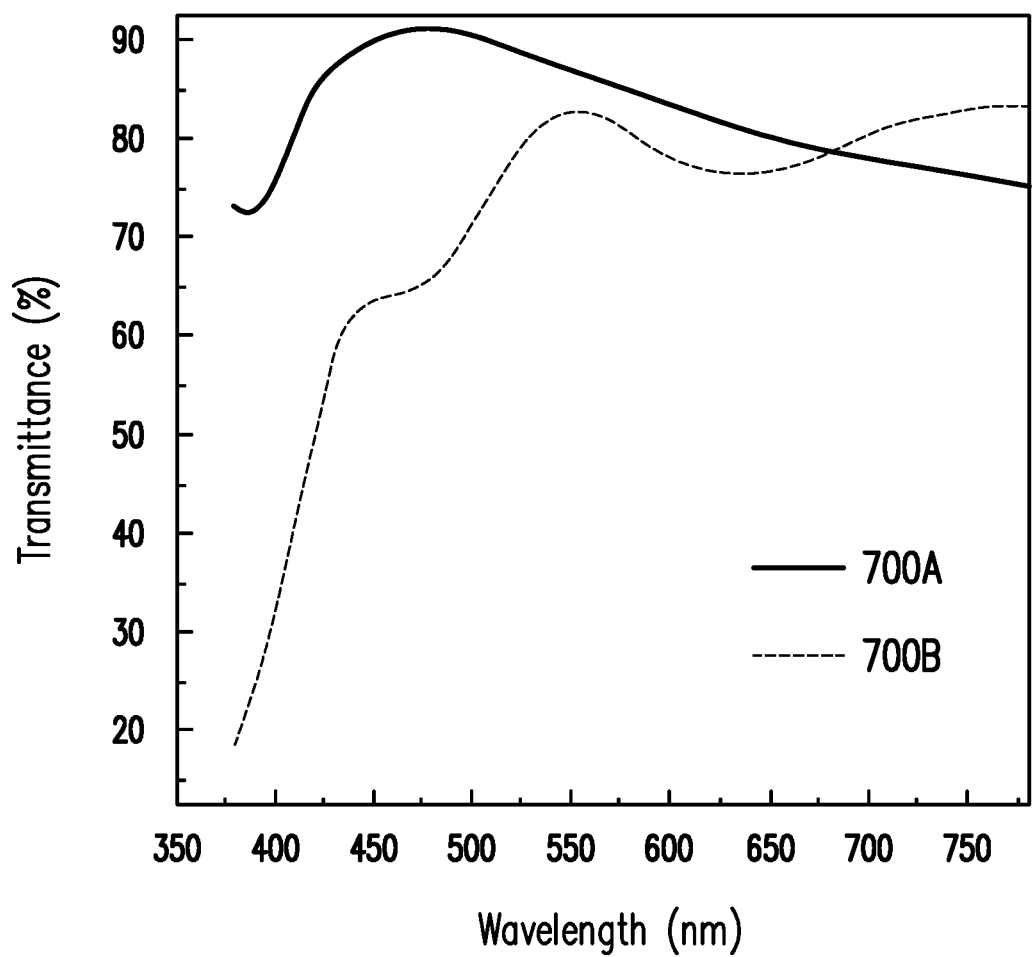
FIG. 7C is an optical simulation result of the structure of the first group of light-emitting devices.

Next, an optical simulation is performed with light-emitting devices having different structures to explain the optical effects of the light-emitting devices of the embodiments of the disclosure. FIG. 7A and FIG. 7B show the structure of a first group of light-emitting devices used in optical simulation. FIG. 7C is an optical simulation result of the structure of the first group of light-emitting devices.

Please refer to FIG. 7A and FIG. 7B first. FIG. 7A is a light-emitting device 700A of an embodiment of the disclosure used in optical simulation, and the structure shown in FIG. 7A includes only the light-emitting region $A_E$. The light-emitting device 700A includes the substrate 120, the light-emitting layer 161, the first electrode 111, the metal layer 510, and the cover plate 180. The light-emitting layer 161 is disposed on the substrate 120, the first electrode 111 is disposed on the light-emitting layer 161, the metal layer 510 is disposed on the first electrode 111, and the cover plate 180 is disposed on the metal layer 510. The material of the metal layer 510 is silver (Ag), and the materials of the substrate 120, the light-emitting layer 161, the first electrode 111, the metal layer 510, and the cover plate 180 are as provided in each embodiment above. The first electrode 111 is alkali metal salt LiF doped with metal aluminum (Al), and the mixed weight ratio of Al to LiF is 2:3. The thicknesses of the light-emitting layer 161, the first electrode 111, the metal layer 510, and the cover plate 180 of the light-emitting device 700A are 100 nm, 7 nm, 7 nm, and 20 nm, respectively.

FIG. 7B is a light-emitting device 700B of the comparative example, wherein the light-emitting device 700B includes the substrate 120, the light-emitting layer 161, the first electrode 111, an electrode 710, and the cover plate 180. The light-emitting layer 161 is disposed on the substrate 120, the first electrode 111 is disposed on the light-emitting layer 161, the electrode 710 is disposed on the first electrode 111, and the cover plate 180 is disposed on the electrode 710.

The material of the electrode 710 is indium zinc oxide (IZO). The thicknesses of the light-emitting layer 161, the first electrode 111, the electrode 710, and the cover plate 180 of the light-emitting device 700B are 100 nm, 7 nm, 7 nm, and 20 nm, respectively. The materials of the substrate 120, the light-emitting layer 161, the first electrode 111, and the cover plate 180 of the light-emitting device 700B are the same as the materials of the corresponding elements in the light-emitting device 700A.

FIG. 7C is an optical simulation result of different light-emitting devices. That is, FIG. 7C depicts the optical simulation result of the light-emitting device 700A and the light-emitting device 700B of the comparative example. The horizontal axis of FIG. 7C is wavelength in nm and the vertical axis is transmittance. The solid curve is the relationship between wavelength and transmittance of the light-emitting device 700A, and the dashed curve is the relationship between wavelength and transmittance of the light-emitting device 700B of the comparative example. It may be seen that in the visible light wavelength range (about 400 nm to 700 nm) of FIG. 7C, at the same wavelength, the transmittance of the light-emitting device 700A is higher than the transmittance of the light-emitting device 700B. In an embodiment of the disclosure, metal oxide or alkali metal salt doped with a metal and an auxiliary electrode are used as the cathode, but since the auxiliary electrode is disposed in the non-light-emitting region of the light-emitting device, the simulated elements do not include the auxiliary electrode. In the light-emitting device 700A, silver metal and the first electrode 111 are used as the cathode, and in the light-emitting device 700B of the comparative example, a transparent metal oxide (for example, IZO) and the first electrode 111 are used as the cathode. It may be seen from FIG. 7C that the transmittance of the light-emitting device of an embodiment of the disclosure is higher, and therefore the light-emitting device also has a smaller yellowness index.

Figure 8A:
FIG. 8A and FIG. 8B show the structure of a second group of light-emitting devices used in optical simulation.
Figure 8B:
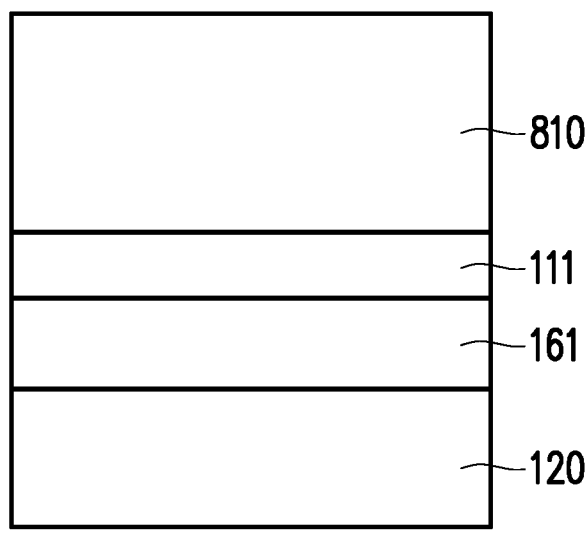
Figure 8C:
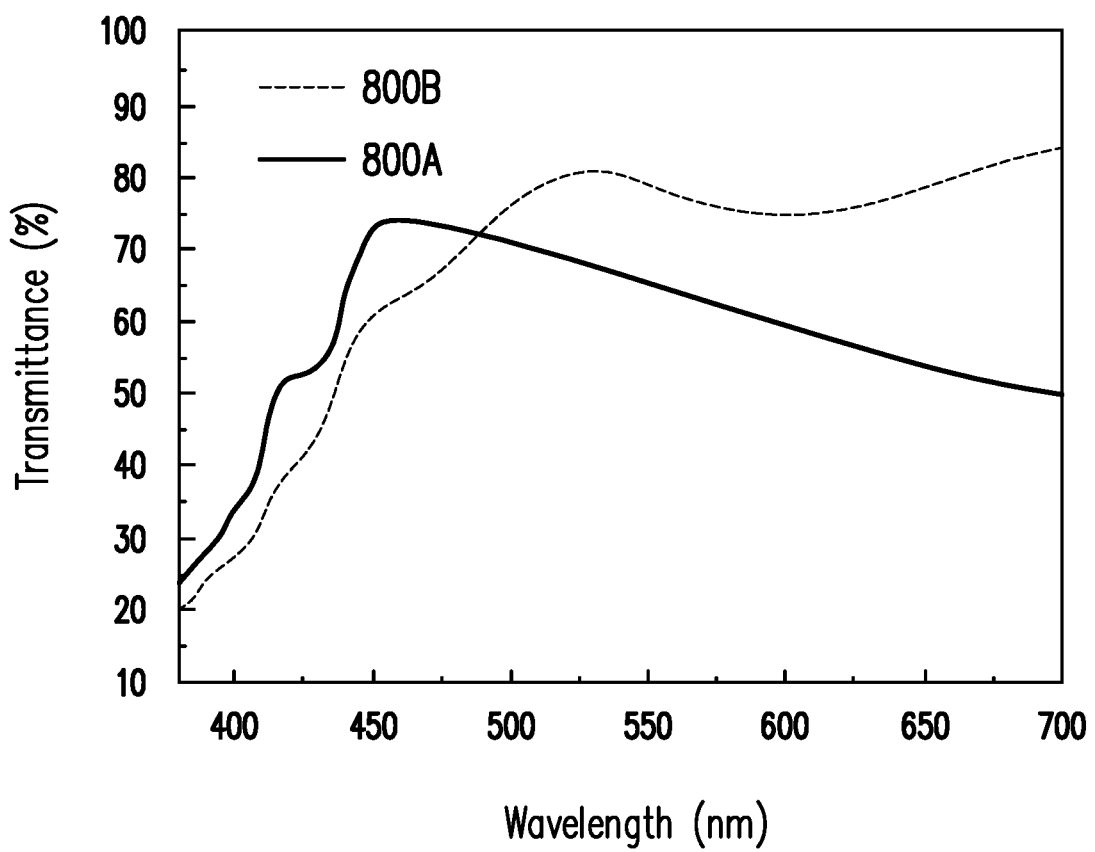
FIG. 8C is an optical simulation result of the structure of the second group of light-emitting devices.

FIG. 8A and FIG. 8B show the structure of a second group of light-emitting devices used in optical simulation. FIG. 8C is an optical simulation result of the structure of the second group of light-emitting devices.

Referring to FIG. 8A and FIG. 8B first, FIG. 8A and FIG. 8B show the structure of another group of light-emitting devices used in optical simulation. FIG. 8A is a light-emitting device 800A of an embodiment of the disclosure used in optical simulation, and the structure shown in FIG. 8A includes only the light-emitting region $A_E$. The light-emitting device 800A includes the substrate 120, the light-emitting layer 161, the first electrode 111, the metal layer 510, and the cover plate 180. The light-emitting layer 161 is disposed on the substrate 120, the first electrode 111 is disposed on the light-emitting layer 161, the metal layer 510 is disposed on the first electrode 111, and the cover plate 180 is disposed on the metal layer 510. The material of the metal layer 510 is silver (Ag), and the materials of the substrate 120, the light-emitting layer 161, the first electrode 111, the metal layer 510, and the cover plate 180 are as provided in each embodiment above. The first electrode 111 is alkali metal salt LiF doped with metal aluminum (Al), and the mixed weight ratio of Al to LiF is 2:3. The difference between the light-emitting device 800A and the light-emitting device 700A is that the thicknesses of the light-emitting layer 161, the first electrode 111, the metal layer 510, and the cover plate 180 of the light-emitting device 800A are 40 nm, 7 nm, 14 nm, and 40 nm, respectively.

FIG. 8B is a light-emitting device 800B of the comparative example, wherein the light-emitting device 800B includes the substrate 120, the light-emitting layer 161, the first electrode 111, and an electrode 810. The light-emitting layer 161 is disposed on the substrate 120, the first electrode 111 is disposed on the light-emitting layer 161, and the electrode 810 is disposed on the first electrode 111. The material of the electrode 810 is indium zinc oxide (IZO). The thicknesses of the light-emitting layer 161, the first electrode 111, and the electrode 810 of the light-emitting device 800B are 40 nm, 7 nm, and 300 nm, respectively. The materials of the substrate 120, the light-emitting layer 161, and the first electrode 111 of the light-emitting device 800B are the same as the materials of the corresponding elements in the light-emitting device 800A.

FIG. 8C is an optical simulation result of different light-emitting devices. That is, FIG. 8C depicts the optical simulation result of the light-emitting device 800A and the light-emitting device 800B of the comparative example. The horizontal axis of FIG. 8C is wavelength in nm and the vertical axis is transmittance. The solid curve is the relationship between wavelength and transmittance of the light-emitting device 800A, and the dashed curve is the relationship between wavelength and transmittance of the light-emitting device 800B of the comparative example. Table 1 shows the transmittance (%), yellowness index b*, and conductivity ($\Omega/\square$, the unit of conductivity may be ohm meters or ohms centimeters) of the light-emitting device 800A and the light-emitting device 800B of the comparative example. It may be seen from FIG. 8C and Table 1 that at a wavelength of 550 nm, although the transmittance of the light-emitting device 800A is lower, the yellowness index thereof is significantly reduced to −3.3 as compared with the yellowness index of 14.7 of the light-emitting device 800B. In an embodiment of the disclosure, a metal oxide or alkali metal salt doped with a metal and an auxiliary electrode are used as the cathode, but since the auxiliary electrode is disposed in the non-light-emitting region of the light-emitting device, the simulated elements do not include the auxiliary electrode.

TABLE 1

| Device | Transmittance (%) | Yellowness index b* | Conductivity ($\Omega/\square$) |
|---|---|---|---|
| 800A | 77.2 | 14.7 | 27.9 |
| 800B | 64.4 | −3.3 | 40 |

Figure 9A:
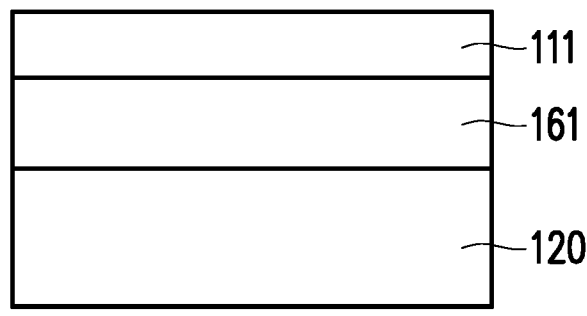
FIG. 9A and FIG. 9B show the structure of a third group of light-emitting devices used in optical simulation.
Figure 9B:
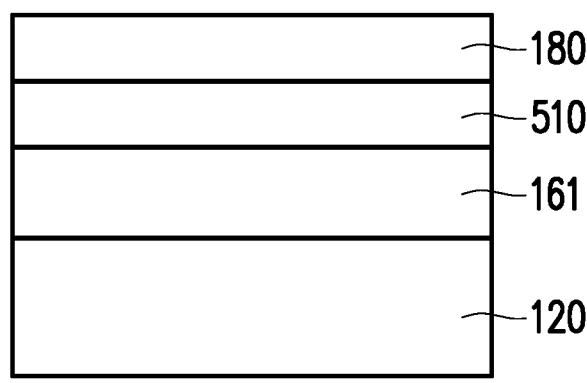
Figure 9C:
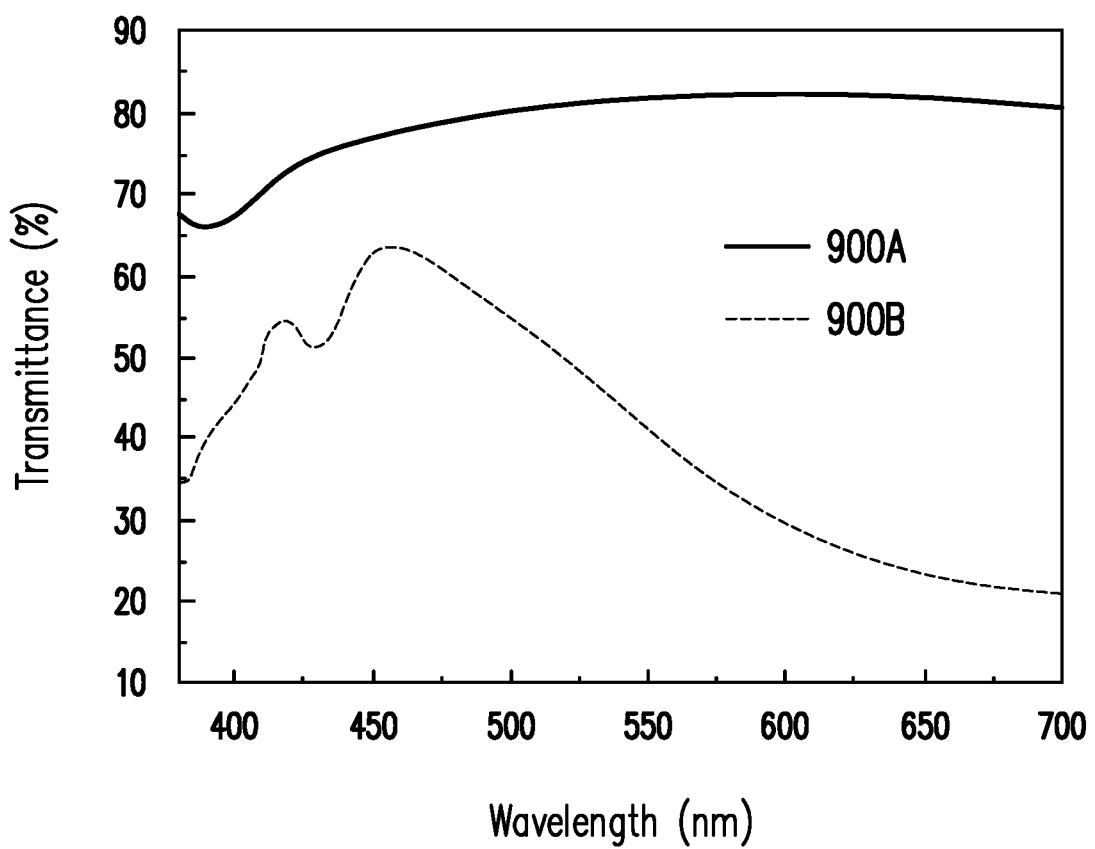
FIG. 9C is an optical simulation result of the structure of the third group of light-emitting devices.

FIG. 9A and FIG. 9B show the structure of a third group of light-emitting devices used in optical simulation. FIG. 9C is an optical simulation result of the structure of the third group of light-emitting devices.

Referring to FIG. 9A and FIG. 9B first, FIG. 9A and FIG. 9B show the structure of the third group of light-emitting devices used in optical simulation. A light-emitting device 900A shown in FIG. 9A includes only the light-emitting region $A_E$. The light-emitting device 900A includes the substrate 120, the light-emitting layer 161, and the first electrode 111. The light-emitting layer 161 is disposed on the substrate 120, and the first electrode 111 is disposed on the light-emitting layer 161. The materials of the substrate 120, the light-emitting layer 161, and the first electrode 111 are as provided in each embodiment above. The first electrode 111 is alkali metal salt LiF doped with metal aluminum (Al), and the mixed weight ratio of Al to LiF is 2:3. The thicknesses of the light-emitting layer 161 and the first electrode 111 of the light-emitting device 900A are 40 nm and 7 nm, respectively.

FIG. 9B is a light-emitting device 900B of the comparative example. The light-emitting device 900B includes the substrate 120, the light-emitting layer 161, the metal layer 510 (as an electrode), and the cover plate 180. The light-emitting layer 161 is disposed on the substrate 120, the metal layer 510 is disposed on the light-emitting layer 161, and the cover plate 180 is disposed on the metal layer 510. The thicknesses of the light-emitting layer 161, the metal layer 510, and the cover plate 180 of the light-emitting device 900B are 40 nm, 14 nm, and 40 nm, respectively. The materials of the substrate 120 and the light-emitting layer 161 of the light-emitting device 900B are the same as the materials of the corresponding elements in the light-emitting device 900A.

FIG. 9C is an optical simulation result of different light-emitting devices. That is, FIG. 9C depicts the optical simulation result of the light-emitting device 900A and the light-emitting device 900B of the comparative example. The horizontal axis of FIG. 9C is wavelength in nm and the vertical axis is transmittance. The solid curve is the relationship between wavelength and transmittance of the light-emitting device 900A, and the dashed curve is the relationship between wavelength and transmittance of the light-emitting device 900B of the comparative example. It may be seen from FIG. 9C that in the visible light wavelength range (about 400 nm to 700 nm), comparing the metal aluminum (Al)-doped alkali metal salt LiF as the electrode and the metal layer as the electrode, at the same wavelength, the transmittance of the light-emitting device 900A is higher than the transmittance of the light-emitting device 900B. In an embodiment of the disclosure, metal oxide or alkali metal salt doped with a metal and an auxiliary electrode are used as the cathode, but since the auxiliary electrode is disposed in the non-light-emitting region of the light-emitting device, the simulated elements do not include the auxiliary electrode.

Figure 10A:
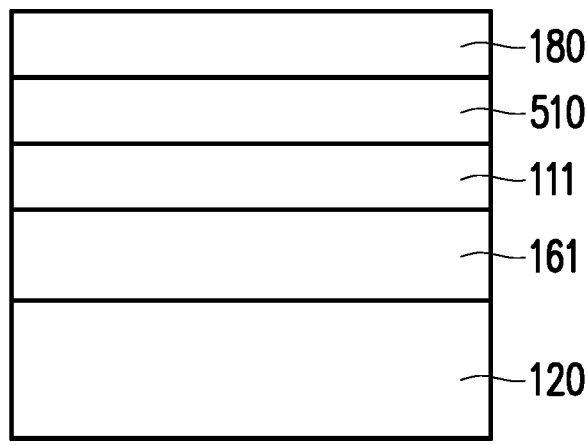
FIG. 10A and FIG. 10B show the structure of a fourth group of light-emitting devices used in optical simulation.
Figure 10B:
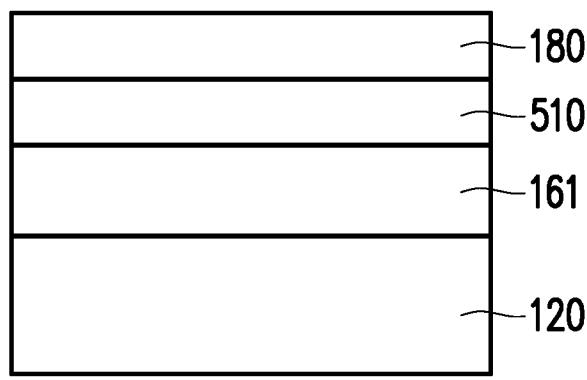
Figure 10C:
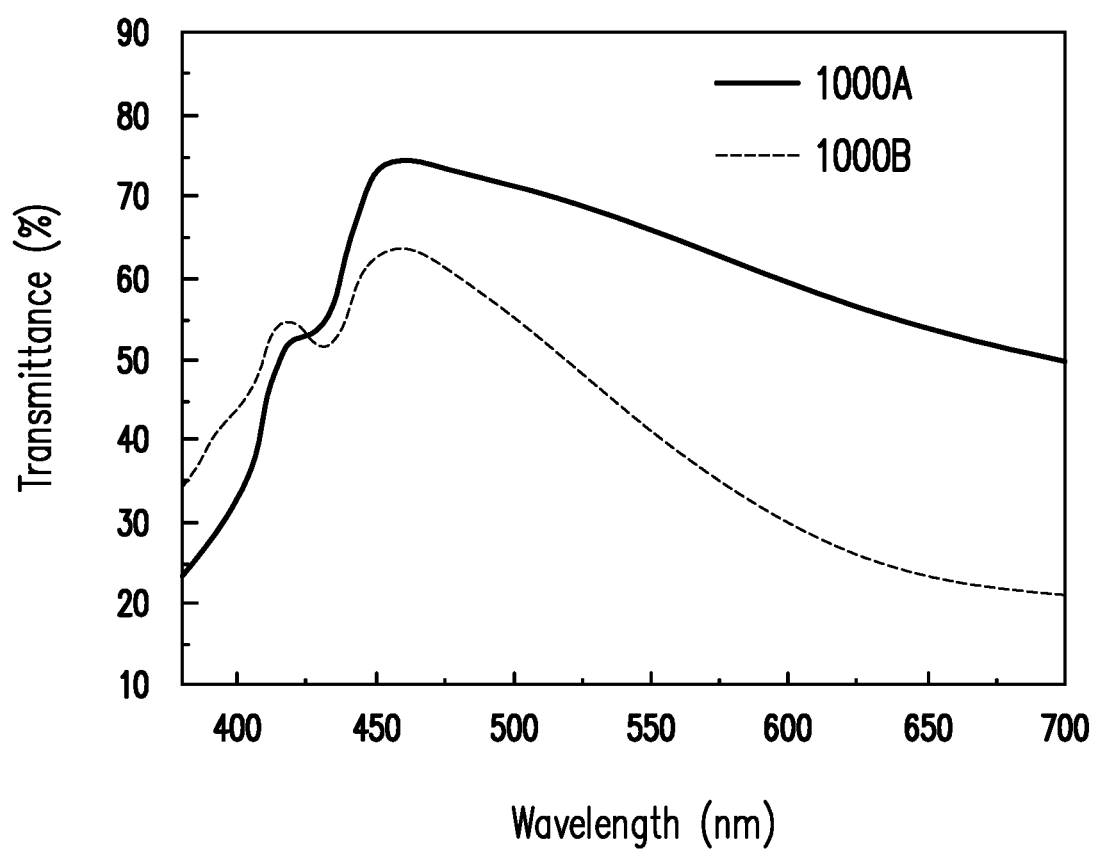
FIG. 10C is an optical simulation result of the structure of the fourth group of light-emitting devices.

FIG. 10A and FIG. 10B show the structure of a fourth group of light-emitting devices used in optical simulation. FIG. 10C is an optical simulation result of the structure of the fourth group of light-emitting devices.

Referring to FIG. 10A and FIG. 10B first, FIG. 10A and FIG. 10B show the structure of the fourth group of light-emitting devices used in optical simulation. The structure shown in FIG. 10A includes only the light-emitting region $A_E$. A light-emitting device 1000A includes the substrate 120, the light-emitting layer 161, the first electrode 111, the metal layer 510, and the cover plate 180. The light-emitting layer 161 is disposed on the substrate 120, the first electrode 111 is disposed on the light-emitting layer 161, the metal layer 510 is disposed on the first electrode 111, and the cover plate 180 is disposed on the metal layer 510. The material of the metal layer 510 is silver (Ag), and the materials of the substrate 120, the light-emitting layer 161, the first electrode 111, the metal layer 510, and the cover plate 180 are as provided in each embodiment above. The first electrode 111 is alkali metal salt LiF doped with metal aluminum (Al), and the mixed weight ratio of Al to LiF is 2:3. The thicknesses of the light-emitting layer 161, the first electrode 111, the metal layer 510, and the cover plate 180 of the light-emitting device 1000A are 40 nm, 7 nm, 14 nm, and 40 nm, respectively.

FIG. 10B is a light-emitting device 1000B of the comparative example. The light-emitting device 1000B includes the substrate 120, the light-emitting layer 161, the metal layer 510 (as an electrode), and the cover plate 180. The light-emitting layer 161 is disposed on the substrate 120, the metal layer 510 is disposed on the light-emitting layer 161, and the cover plate 180 is disposed on the metal layer 510. The thicknesses of the light-emitting layer 161, the metal layer 510, and the cover plate 180 are 40 nm, 14 nm, and 40 nm, respectively. The materials of the substrate 120 and the light-emitting layer 161 of the light-emitting device 1000B are the same as the materials of the corresponding elements in the light-emitting device 1000A.

FIG. 10C is an optical simulation result of different light-emitting devices. That is, FIG. 10C depicts the optical simulation result of the light-emitting device 1000A and the light-emitting device 1000B of the comparative example. The horizontal axis of FIG. 10C is wavelength in nm and the vertical axis is transmittance. The solid curve is the relationship between wavelength and transmittance of the light-emitting device 1000A, and the dashed curve is the relationship between wavelength and transmittance of the light-emitting device 1000B of the comparative example. It may be seen from FIG. 10C that in the visible light wavelength range (about 400 nm to 700 nm), comparing the metal aluminum (Al)-doped alkali metal salt LiF as the electrode and the metal layer as the electrode, except at a short wavelength (about 425 nm or less), at the same wavelength, the transmittance of the light-emitting device 1000A is higher than the transmittance of the light-emitting device 1000B of the comparative example. It may be seen that the addition of the alkali metal salt doped with a metal as the electrode layer may reduce surface plasmon polariton (SPP) and improve transmittance. In an embodiment of the disclosure, a metal oxide or alkali metal salt doped with a metal and an auxiliary electrode are used as the cathode, but since the auxiliary electrode is disposed in the non-light-emitting region of the light-emitting device, the simulated elements do not include the auxiliary electrode.

Based on the above, the embodiments of the disclosure include the use of metal oxide or alkali metal salt doped with a metal in combination with an auxiliary electrode as the electrodes of the light-emitting device, which is compatible with existing AMOLED processes and does not require a complicated process and structural design to improve the overall transmittance of the electrodes and maintain high conductivity, and may be widely applied to transparent products to achieve the effect of increased transmittance and increased luminous efficiency. The embodiments of the disclosure also provide a light-emitting device may be applied to a transparent display of a larger size.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electrode of a light-emitting device, wherein the light-emitting device has a light-transmitting region and a non-light-transmitting region, the electrode comprising:
   a first electrode;
   an auxiliary electrode disposed in the non-light-transmitting region and outside the light-transmitting region, on the first electrode and covering a portion of the first electrode, wherein a material of the first electrode is a metal oxide or alkali metal salt doped with a metal, and a material of the auxiliary electrode comprises a metal or an alloy thereof;
   a metal layer located between the first electrode and the auxiliary electrode; and an optical matching layer conformally formed on the auxiliary electrode, wherein a refractive index of the optical matching layer is 1.3 to 2.5.

2. The electrode of the light-emitting device of claim 1, wherein the metal oxide comprises $LiO_2$ (lithium superoxide) or $MoO_3$ (molybdenum trioxide), the alkali metal salt comprises LiF (lithium fluoride), $LiBO_3$ (lithium borate), $K_2SiO_3$ (potassium citrate), $Cs_2CO_3$ (barium carbonate), or $CH_3COOM$ (acetate), M is Li (lithium), Na (sodium), K (potassium), Rb (rubidium), or Cs (cesium).

3. The electrode of the light-emitting device of claim 1, wherein the metal doped in the first electrode comprises Al (aluminum), Ca (calcium), Ag (silver), Cu (copper), Mg (magnesium), or an alloy thereof.

4. The electrode of the light-emitting device of claim 1, wherein the metal doped in the first electrode comprises at least two different metals, and the at least two different metals comprise Al (aluminum), Ca (calcium), Ag (silver), Cu (copper), Mg (magnesium), or an alloy thereof.

5. The electrode of the light-emitting device of claim 1, wherein a mixed weight ratio of the metal doped to the alkali metal salt is between 2:1 and 1:5, a mixed weight ratio of the metal doped to the metal oxide is between 2:1 and 1:5.

6. The electrode of the light-emitting device of claim 1, wherein a thickness of the first electrode is less than or equal to 30 nm, a thickness of the auxiliary electrode is between 300 nm and 500 nm.

7. The electrode of the light-emitting device of claim 1, wherein the auxiliary electrode is in direct contact with the first electrode.

8. The electrode of the light-emitting device of claim 1, wherein a thickness of the metal layer is between 5 nm and 10 nm.

9. A light-emitting device, having a light-transmitting region and a non-light-transmitting region, the light-emitting device comprising:
a substrate;
an active device layer disposed on the substrate;
an insulating layer disposed on the substrate and the active device layer;
a pixel-defining layer disposed on a portion of the insulating layer;
a light-emitting element disposed on the insulating layer, comprising a first electrode, a light-emitting layer, and a second electrode, wherein the second electrode is disposed on the insulating layer and located between the insulating layer and the pixel-defining layer and electrically connected to the active device layer, and the light-emitting layer is located between the second electrode and the first electrode in the light-transmitting region;
an auxiliary electrode disposed on a portion of the first electrode and covering the active device layer, and the auxiliary electrode is located in the non-light-transmitting region and outside the light-transmitting region;
a metal layer located between the first electrode and the auxiliary electrode;
an optical matching layer conformally formed on the auxiliary electrode, wherein a refractive index of the optical matching layer is 1.3 to 2.5; and
a thin-film encapsulation layer covering the light-emitting element and the auxiliary electrode;
wherein a material of the first electrode is a metal oxide or alkali metal salt doped with a metal, and a material of the auxiliary electrode comprises a metal or an alloy thereof.

10. The light-emitting device of claim 9, wherein the metal oxide comprises $LiO_2$ (lithium superoxide) or $MoO_3$ (molybdenum trioxide), the alkali metal salt comprises LiF (lithium fluoride), $LiBO_3$ (lithium borate), $K_2SiO_3$ (potassium citrate), $Cs_2CO_3$ (barium carbonate), or $CH_3COOM$ (acetate), M is Li (lithium), Na (sodium), K (potassium), Rb (rubidium), or Cs (cesium).

11. The light-emitting device of claim 9, wherein the metal doped in the first electrode comprises Al (aluminum), Ca (calcium), Ag (silver), Cu (copper), Mg (magnesium), or an alloy thereof.

12. The light-emitting device of claim 9, wherein a mixed weight ratio of the metal doped to the alkali metal salt is between 2:1 and 1:5, a mixed weight ratio of the metal doped to the metal oxide is between 2:1 and 1:5.

13. The light-emitting device of claim 9, wherein a thickness of the first electrode is less than or equal to 30 nm, a thickness of the auxiliary electrode is between 300 nm and 500 nm.

14. The light-emitting device of claim 9, wherein the auxiliary electrode is in direct contact with the first electrode.

15. The light-emitting device of claim 9, wherein a thickness of the metal layer is between 5 nm and 10 nm.

16. The light-emitting device of claim 15, wherein the metal layer comprises Ag (silver) or Au (gold).

17. The light-emitting device of claim 9, further comprising a metal oxide layer, wherein the metal oxide layer is located between the first electrode and the auxiliary electrode.

18. The light-emitting device of claim 17, further comprising an alienation layer, wherein the alienation layer is disposed on the metal oxide layer exposed by the auxiliary electrode.

* * * * *